United States Patent
Im

(10) Patent No.: US 10,770,383 B2
(45) Date of Patent: Sep. 8, 2020

(54) SEMICONDUCTOR DEVICE HAVING FLEXIBLE INTERCONNECTION AND METHOD FOR FABRICATING THE SAME

(71) Applicant: SAMSUNG ELECTRONICS CO., LTD., Suwon-si, Gyeonggi-do (KR)

(72) Inventor: Hohyeuk Im, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/413,757

(22) Filed: May 16, 2019

(65) Prior Publication Data

US 2019/0273039 A1    Sep. 5, 2019

Related U.S. Application Data

(63) Continuation of application No. 15/252,519, filed on Aug. 31, 2016, now Pat. No. 10,553,529.

(30) Foreign Application Priority Data

Oct. 27, 2015   (KR) .................. 10-2015-0149561

(51) Int. Cl.
   *H01L 23/34*   (2006.01)
   *H01L 23/498*  (2006.01)
   *H01L 25/065*  (2006.01)

(52) U.S. Cl.
   CPC .... *H01L 23/49827* (2013.01); *H01L 23/4985* (2013.01); *H01L 23/49894* (2013.01); *H01L 25/0655* (2013.01); *H01L 23/49811* (2013.01); *H01L 23/49822* (2013.01); *H01L 2224/18* (2013.01); *H01L 2225/06513* (2013.01);

(Continued)

(58) Field of Classification Search
   CPC ....... H01L 2224/0237; H01L 2224/023; H01L 2224/16226; H01L 2224/2919
   USPC ......................................... 257/723, 724, 778
   See application file for complete search history.

(56) References Cited

U.S. PATENT DOCUMENTS 4,783,695 A * 11/1988 Eichelberger ....... H01L 23/5385
                                                         257/668
5,353,498 A * 10/1994 Fillion ................. H01L 21/568
                                                       257/E21.505

(Continued)

FOREIGN PATENT DOCUMENTS

JP    2003133518    5/2003
KR    10-0228336    8/1999

(Continued)

*Primary Examiner* — S. V. Clark

(74) *Attorney, Agent, or Firm* — F. Chau & Associates, LLC

(57) ABSTRACT

A semiconductor device includes a plurality of semiconductor chips spaced apart from each other. A space region is formed between adjacent semiconductor chips of the plurality of semiconductor chips. A redistribution layer is disposed on at least one of the semiconductor chips. The redistribution layer includes at least one redistribution line electrically connected to the at least one of the semiconductor chip. The redistribution layer includes an interconnection disposed in the space region. The interconnection includes an organic layer disposed on the at least one redistribution line. The organic layer is more flexible than the plurality of semiconductor chips.

6 Claims, 19 Drawing Sheets

(52) U.S. Cl.
CPC ............... *H01L 2225/06527* (2013.01); *H01L 2225/06555* (2013.01)

(56) References Cited

U.S. PATENT DOCUMENTS

| | | | |
|---|---|---|---|
| 5,866,952 A * | 2/1999 | Wojnarowski | H01L 21/568 257/788 |
| 6,365,974 B1 | 4/2002 | Abbott et al. | |
| 6,410,983 B1 | 6/2002 | Moriizumi et al. | |
| 6,717,275 B2 | 4/2004 | Matsuura et al. | |
| 6,995,043 B2 * | 2/2006 | Corisis | H01L 23/5385 257/701 |
| 6,995,943 B1 | 2/2006 | Corisis et al. | |
| 7,355,271 B2 | 4/2008 | Volant et al. | |
| 7,372,139 B2 * | 5/2008 | Lee | H01L 23/49805 257/528 |
| 7,804,171 B2 * | 9/2010 | Bolken | H01L 23/5389 257/724 |
| 7,808,073 B2 * | 10/2010 | Wakisaka | H01G 4/228 257/528 |
| 7,838,409 B2 * | 11/2010 | Zingher | H01L 23/48 257/664 |
| 8,049,332 B2 | 11/2011 | Oh et al. | |
| 8,362,481 B2 * | 1/2013 | Sellathamby | H01L 23/48 257/48 |
| 2002/0114143 A1 | 8/2002 | Morrison et al. | |
| 2002/0159242 A1 * | 10/2002 | Nakatani | H01L 21/561 361/760 |
| 2003/0222282 A1 * | 12/2003 | Fjelstad | H01L 23/49805 257/200 |
| 2015/0206816 A1 | 7/2015 | Woo et al. | |
| 2015/0262931 A1 * | 9/2015 | Vincent | H01L 21/76838 257/773 |
| 2017/0117215 A1 | 4/2017 | Im | |

FOREIGN PATENT DOCUMENTS

| | | |
|---|---|---|
| KR | 10-0604332 | 7/2006 |
| KR | 1020080049681 | 6/2008 |

* cited by examiner

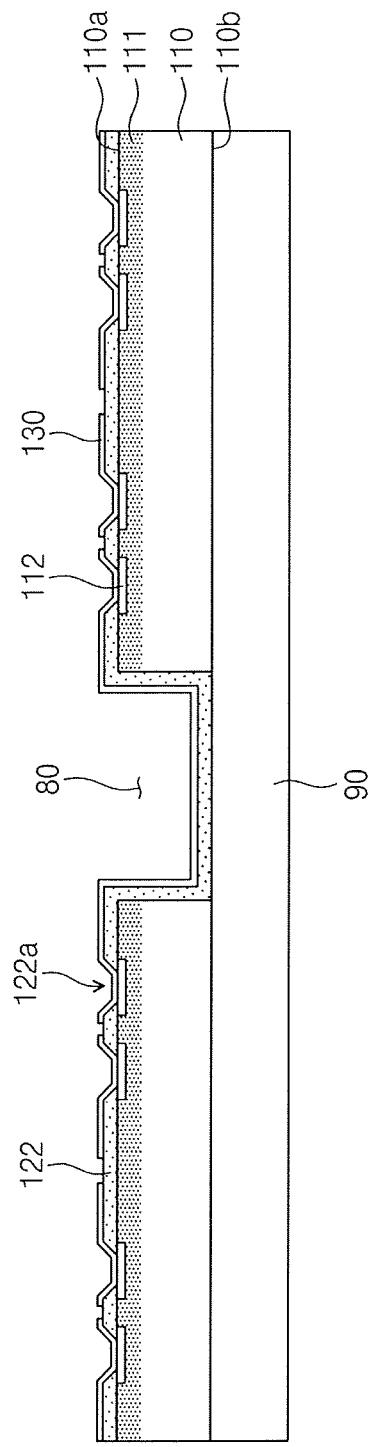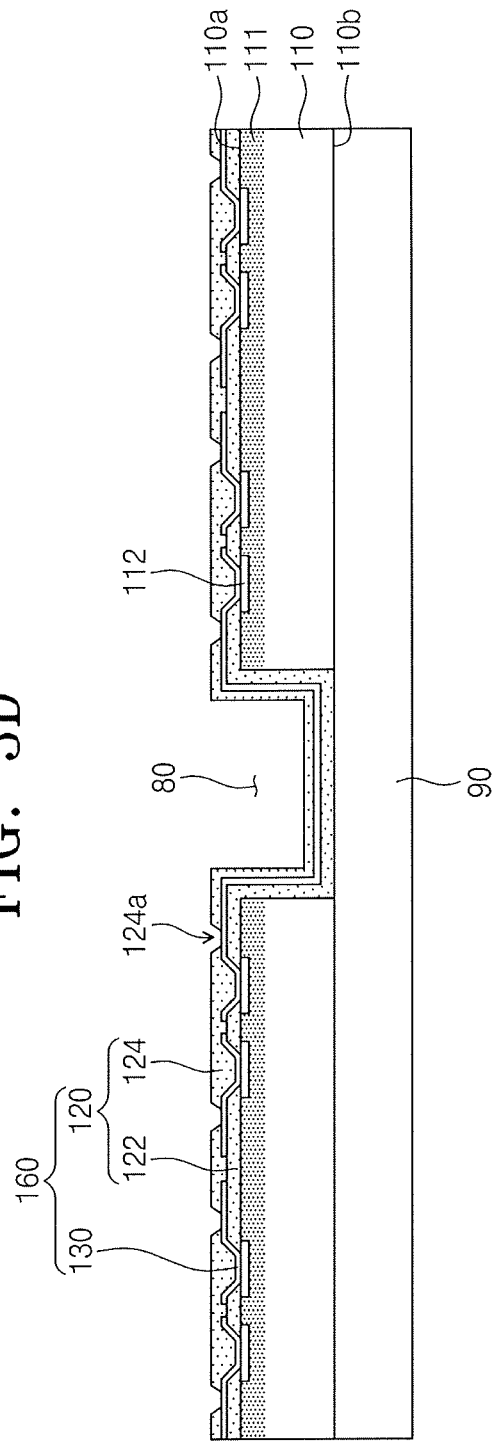

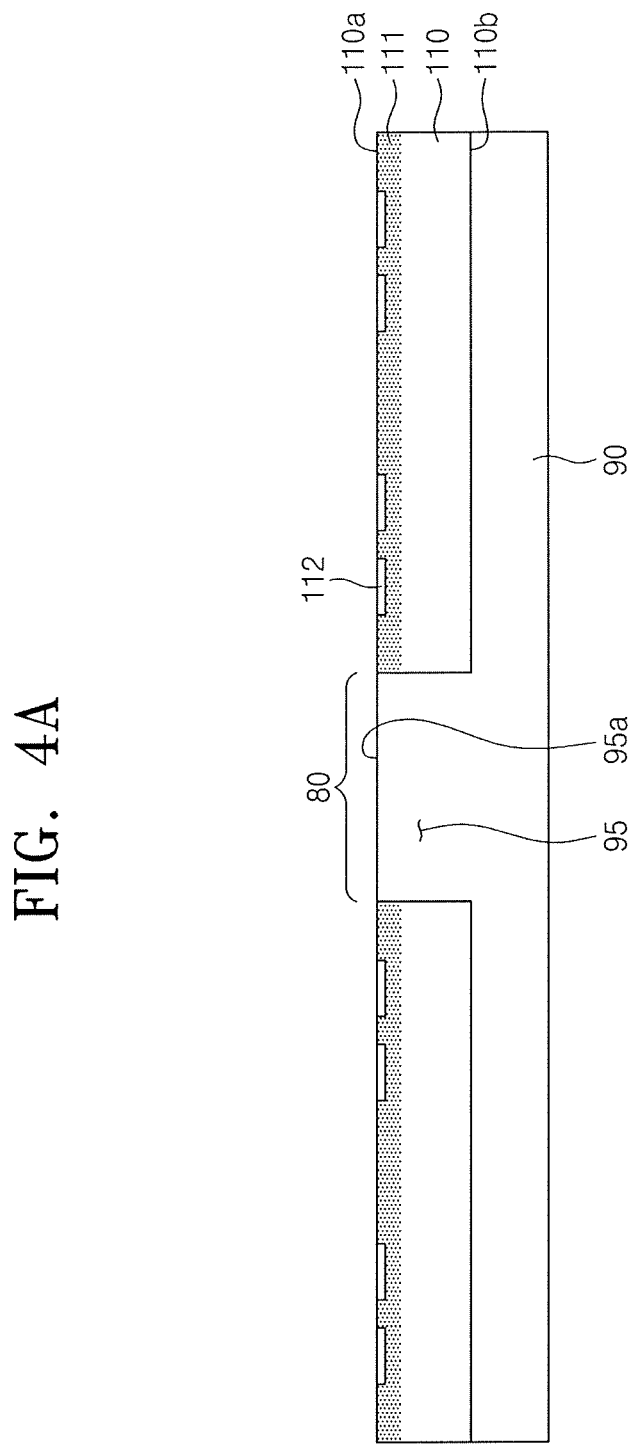

SEMICONDUCTOR DEVICE HAVING FLEXIBLE INTERCONNECTION AND METHOD FOR FABRICATING THE SAME

CROSS-REFERENCE TO RELATED APPLICATIONS

This application is a continuation of U.S. patent application Ser. No. 15/252,519 filed Aug. 31, 2016, which claims priority under 35 U.S.C. § 119 to Korean Patent Application No. 10-2015-0149561, filed on Oct. 27, 2015, in the Korean Intellectual Property Office, the disclosures of which are incorporated by reference herein in their entireties.

TECHNICAL FIELD

Exemplary embodiments of the present inventive concept relate to a semiconductor device, and more particularly to a semiconductor device having flexible interconnections and a method for fabricating the same.

DISCUSSION OF RELATED ART

Semiconductor devices included in wearable devices may have flexibility and may support bending characteristics of the wearable devices.

SUMMARY

Exemplary embodiments of the present inventive concept may provide a semiconductor device having a flexible structure and a method for fabricating the same.

According to an exemplary embodiment of the present inventive concept, a semiconductor device includes a plurality of semiconductor chips spaced apart from each other. A space region is formed between adjacent semiconductor chips of the plurality of semiconductor chips. A redistribution layer is disposed on at least one of the semiconductor chips. The redistribution layer includes at least one redistribution line electrically connected to the at least one of the semiconductor chip. The redistribution layer includes an interconnection disposed in the space region. The interconnection includes an organic layer disposed on the at least one redistribution line. The organic layer is more flexible than the plurality of semiconductor chips.

According to an exemplary embodiment of the present inventive concept, a semiconductor device includes at least two semiconductor chips not physically bonded to each other, each of the semiconductor chips having a circuit layer. A redistribution layer is disposed on the circuit layers of the semiconductor chips. The redistribution layer is electrically connected to the circuit layer. The redistribution layer includes a redistribution line electrically connected to the circuit layer, and an insulating layer surrounding the redistribution line. The insulating layer is softer than the semiconductor chips. The redistribution layer includes an interconnection connecting the at least two semiconductor chips to each other.

According to an exemplary embodiment of the present inventive concept, a semiconductor device includes at least two semiconductor chips spaced apart from each other with a space region formed between each of the at least two semiconductor chips. A redistribution layer is disposed on each of the semiconductor chips. Each of the semiconductor chips includes a top surface including a circuit layer and a bottom surface opposite to the top surface, and a bonding pad exposed through the top surface and electrically connected to the circuit layer. The redistribution layer includes a first insulating layer covering the top surfaces of the semiconductor chips and having first openings exposing the bonding pads. At least one redistribution line is disposed on the first insulating layer and connected to the bonding pads through the first openings. A second insulating layer is disposed on the first insulating layer and covering the at least one redistribution line. The first and second insulating layers include an organic layer softer than the semiconductor chips. An interconnection passes through the space region. The interconnection includes a metal line electrically connecting the at least two semiconductor chips to each other. The organic layer surrounds the metal line. The interconnection is freely bendable between the semiconductor chips.

According to an exemplary embodiment of the present inventive concept, a method for fabricating a semiconductor device includes providing at least two semiconductor chips, each of which includes a circuit layer and bonding pads electrically connected to the circuit layer, and forming a redistribution layer electrically connected to the bonding pads on the semiconductor chips. The forming of the redistribution layer includes forming a first insulating layer having first openings exposing the bonding pads on the semiconductor chips, forming redistribution lines connected to the bonding pads through the first openings on the first insulating layer, and forming a second insulating layer covering the redistribution lines on the first insulating layer. The semiconductor chips are spaced apart from each other with a space region disposed between the semiconductor chips. The first and second insulating layers include an organic layer softer than the semiconductor chips, and the redistribution layer includes a flexible interconnection passing through the space region.

According to an exemplary embodiment of the present inventive concept, a method for fabricating a semiconductor device includes providing at least two semiconductor chips spaced apart from each other on a support plate, and forming a redistribution layer on each of the semiconductor chips. The redistribution layer includes at least one redistribution line electrically connected to the semiconductor chips and an organic layer surrounding the at least one redistribution line. The method includes removing the support plate from the semiconductor chips. The redistribution layer includes a flexible interconnection passing through a space region between the semiconductor chips.

BRIEF DESCRIPTION OF THE DRAWINGS

The above and other features of the present inventive concept will become more apparent by describing in detail exemplary embodiments thereof, with reference to the accompanying drawings in which:

FIGS. 3A to 3G are cross-sectional views illustrating a method for fabricating a semiconductor device according to some exemplary embodiments of the present inventive concept.

FIGS. 4A to 4D are cross-sectional views illustrating a method for fabricating a semiconductor device according to some exemplary embodiments of the present inventive concept.

DETAILED DESCRIPTION OF THE EMBODIMENTS

Figure 1A:
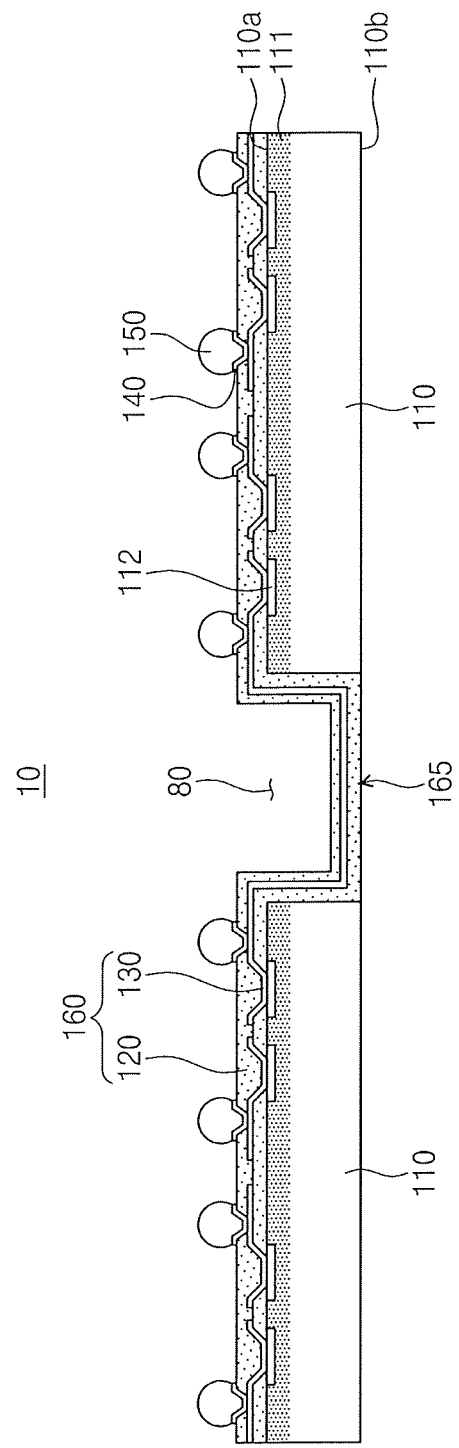
FIG. 1A is a cross-sectional view illustrating a semiconductor device according to some exemplary embodiments of the present inventive concept.
Figure 1B:
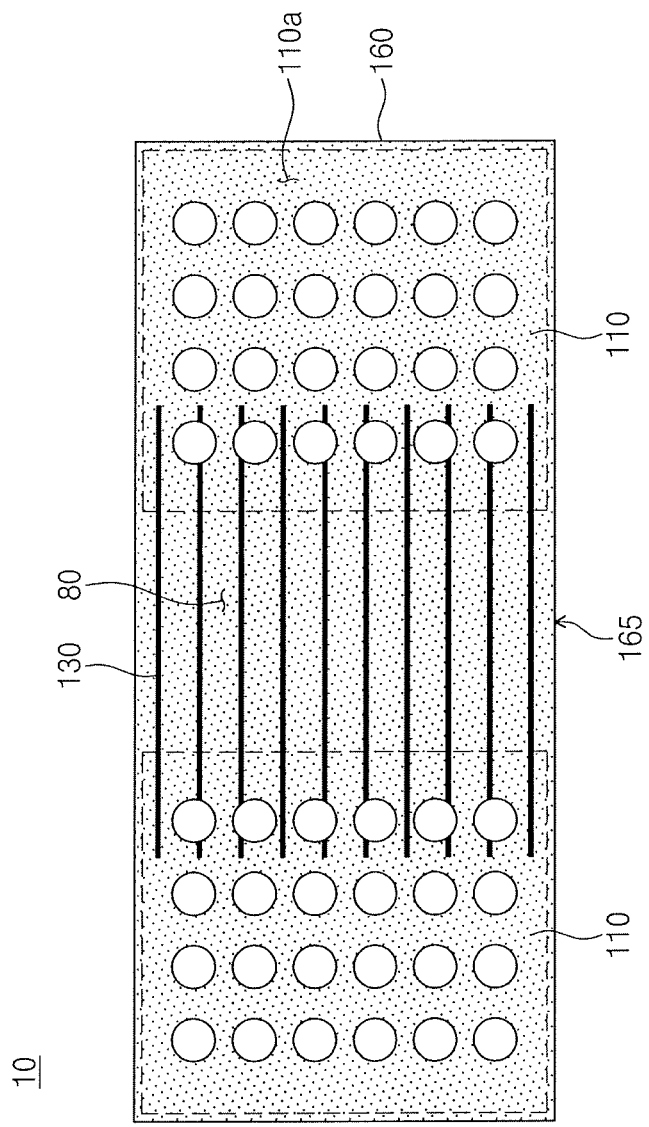
FIGS. 1B to 1D are plan views illustrating a semiconductor device according to some exemplary embodiments of the present inventive concept.
Figure 1C:
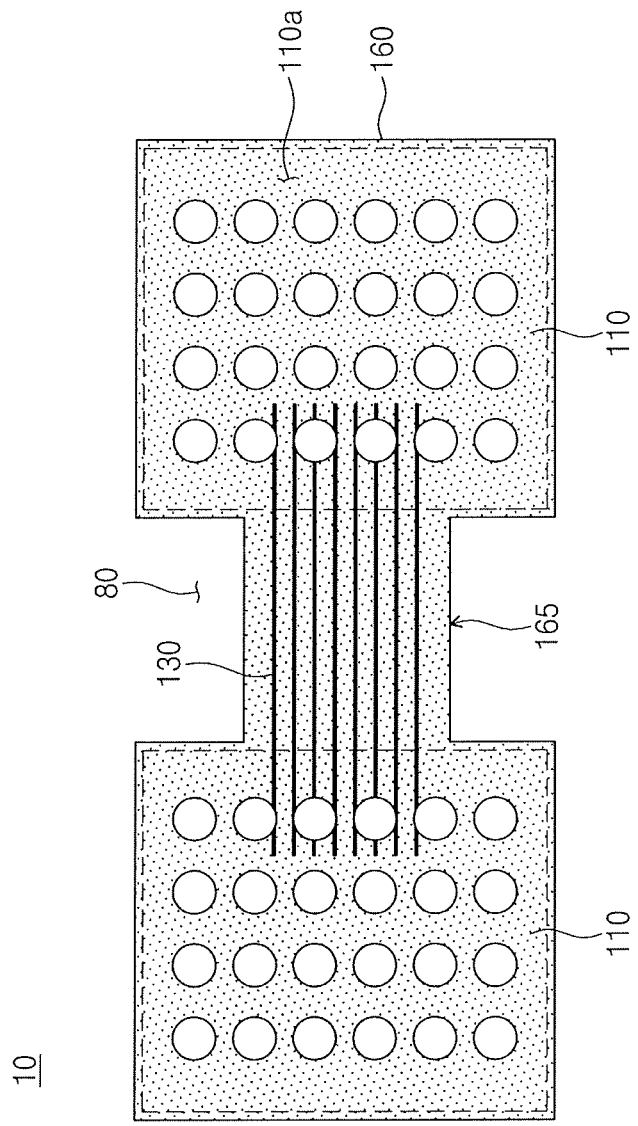
Figure 1D:
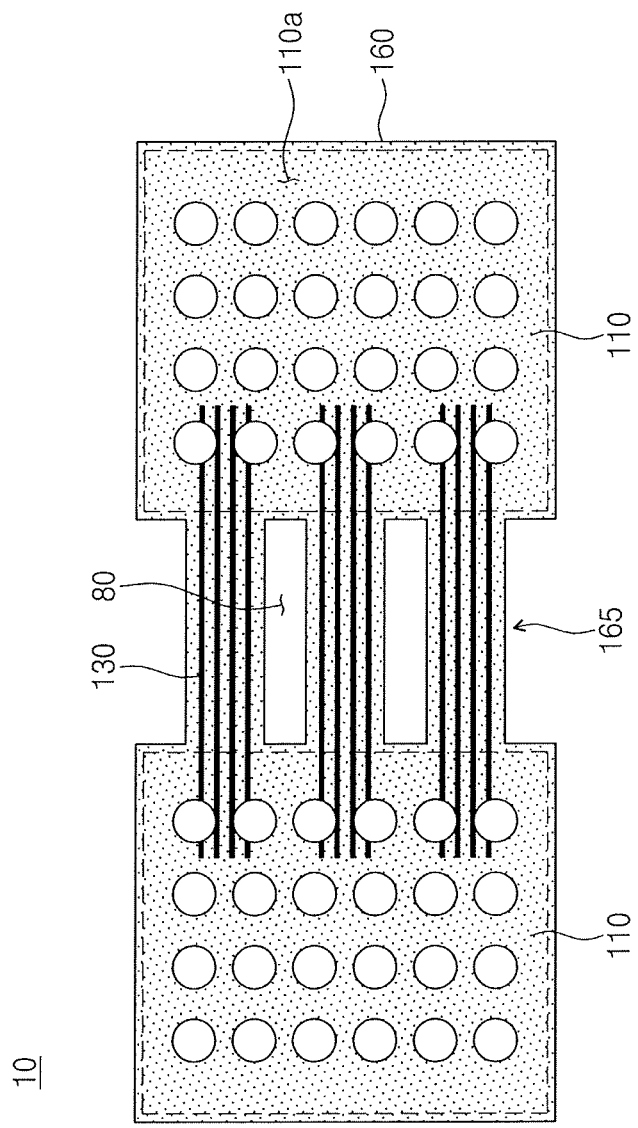
Figure 1E:
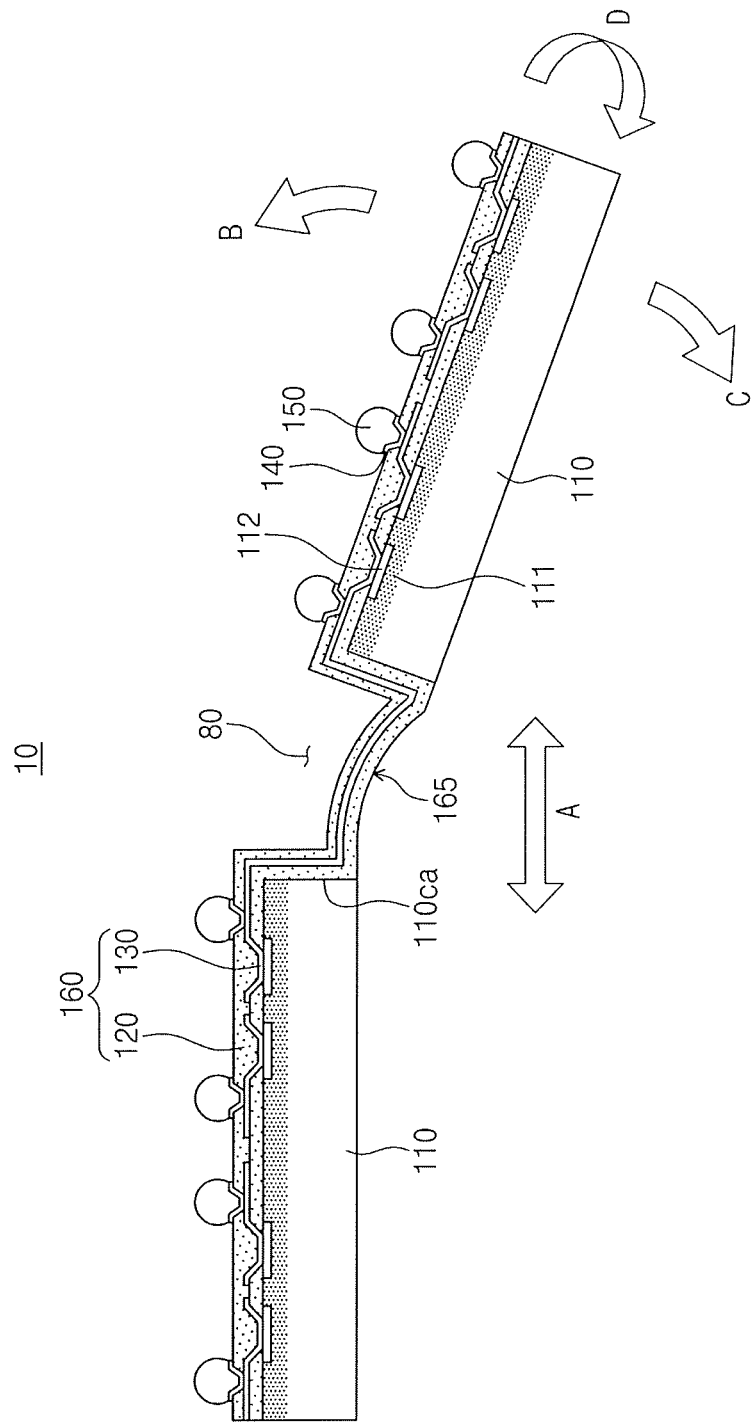
FIGS. 1E and 1F are cross-sectional views illustrating bending of a semiconductor device according to some exemplary embodiments of the present inventive concept.
Figure 1F:
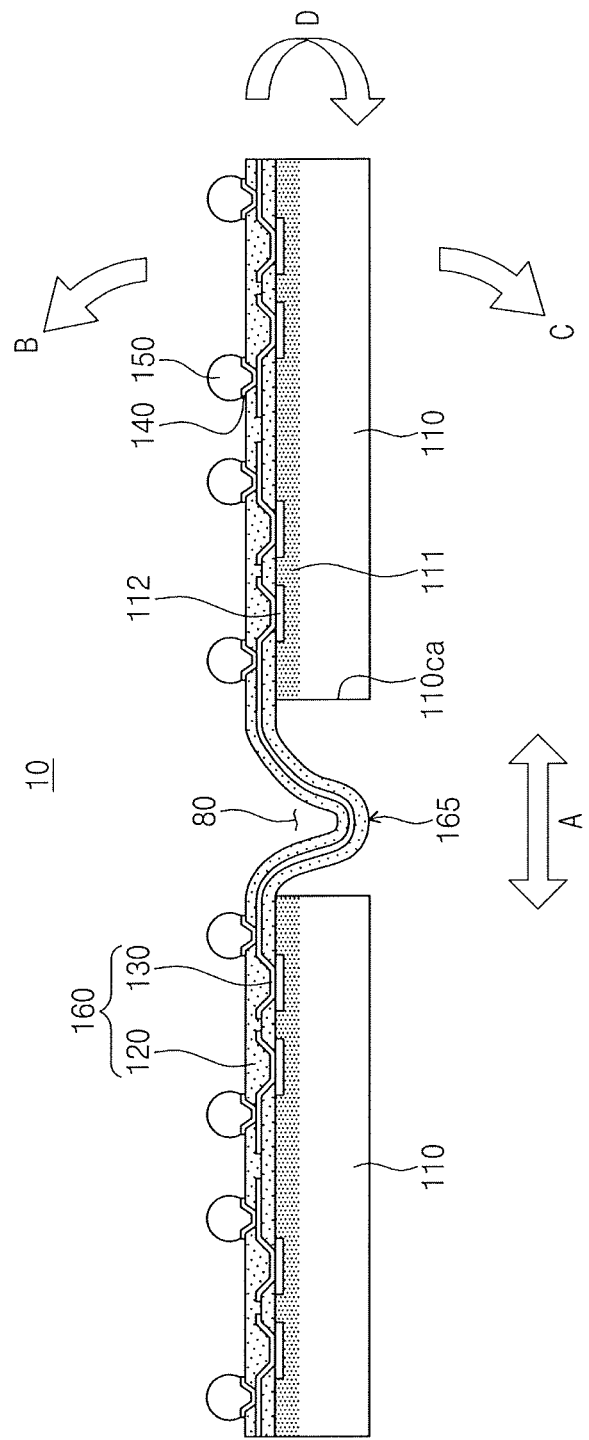

FIG. 1A is a cross-sectional view illustrating a semiconductor device according to some exemplary embodiments of the present inventive concept. FIGS. 1B to 1D are plan views illustrating a semiconductor device according to some exemplary embodiments of the present inventive concept. FIGS. 1E and 1F are cross-sectional views illustrating bending of a semiconductor device according to some exemplary embodiments of the present inventive concept.

Referring to FIG. 1A, a semiconductor device 10 may include at least two semiconductor chips 110 and an interconnection 165 electrically connecting the semiconductor chips 10 to each other. The interconnection 165 may be a flexible interconnection. The semiconductor chips 110 may be spaced apart from each other with a space region 80 disposed between adjacent semiconductor chips 110, and thus the semiconductor chips 110 might not be physically bonded to each other. The semiconductor chip 110 may be a memory chip, a logic chip, or a combination thereof. For example, the semiconductor chip 110 may have a system-in-package (SiP) or a system-on-chip (SoC) configuration.

The semiconductor chip 110 may have a top surface 110a and a bottom surface 110b opposite to the top surface 110a. One of the top surface 110a and the bottom surface 110b of the semiconductor chip 110 may be an active surface, and the other of the top surface 110a and the bottom surface 110b of the semiconductor chip 110 may be an inactive surface. In some exemplary embodiments of the present inventive concept, the top surface 110a of the semiconductor chip 110 may be the active surface on which one or more bonding pads 112 and a circuit layer 111 electrically connected to the bonding pads 112 are disposed. The bottom surface 110b of the semiconductor chip 110 may be the inactive surface.

The semiconductor device 10 may include a redistribution layer 160 disposed on the top surfaces 110a of the semiconductor chips 110. The redistribution layer 160 may be a continuous redistribution layer. The redistribution layer 160 may include a flexible insulating layer 120 surrounding one or more redistribution lines 130. For example, a main constituent of the semiconductor chip 110 may include silicon, and the flexible insulating layer 120 may include a material softer than the main constituent of the semiconductor chip 110. For example, the flexible insulating layer 120 may include an organic layer (e.g., polyimide). The flexible insulating layer 120 including the organic layer may be disposed in the space region 80. For example, a portion of the flexible insulating layer 120 disposed in the space region 80 may include the organic layer. The flexible insulating layer 120 disposed on the semiconductor chips 110 and in the space region 80 may be a continuous, integrally formed layer disposed on each of a plurality of semiconductor chips 110 and in each space region 80 formed between adjacent semiconductor chips 110.

According to an exemplary embodiment of the present inventive concept, the redistribution layer 160 including the flexible insulating layer 120 and the redistribution line may be disposed on each of the semiconductor chips 110 and may be additionally disposed in the space region 80 between adjacent semiconductor chips 110.

The redistribution line 130 may be electrically connected to the bonding pad 112. For example, the redistribution line 130 may include a metal (e.g., copper (Cu) or aluminum (Al)) or an alloy thereof, which may be connected to the bonding pad 112. The redistribution layer 160 may include the interconnection 165 electrically connecting the semiconductor chips 110 to each other. The redistribution line 130 included in the interconnection 165 may electrically connect the semiconductor chips 110 to each other. The interconnection 165 may be a portion of the redistribution layer 160, which passes through the space region 80 between the semiconductor chips 110 adjacent to each other.

The semiconductor device 10 may include one or more external terminals 150 electrically connected to the redistribution layer 160. For example, the external terminals 150 may include solder balls or solder bumps, which are connected to landing pads 140.

Referring, to FIG. 1B, in some exemplary embodiments of the present inventive concept, the redistribution layer 160 may cover substantially the entire top surfaces 110a of the semiconductor chips 110, and the interconnection 165 may occupy substantially the entire space region 80 when viewed from a plan view. In some exemplary embodiments of the present inventive concept, the interconnection 165 may occupy only a portion (e.g., a central portion) of the space region 80 when viewed from a plan view. In some exemplary embodiments of the present inventive concept, a plurality of interconnections 165 may occupy a portion of the space region 80 (see, e.g., FIG. 1D) or substantially the entire space region 80 when viewed from a plan view. The redistribution line 130 may be included in the interconnection 165.

Referring to FIG. 1E, when the flexible insulating layer 120 surrounds the redistribution lines 130, the interconnection 165 may bend freely between the semiconductor chips 110. In some exemplary embodiments of the present inventive concept, one of the semiconductor chips 110 may become closer to or farther away from another of the semiconductor chips 110 by the free bending of the interconnection 165 (A).

In some exemplary embodiments of the present inventive concept, one of the semiconductor chips 110 may ascend to a higher level than another of the semiconductor chips 110 by the free bending of the interconnection 165 (B), or one of the semiconductor chips 110 may descend to a lower level than another of the semiconductor chips 110 by the free bending of the interconnection 165 (C). In some exemplary embodiments of the present inventive concept, at least one of the semiconductor chips 110 may be twisted by the free bending of the interconnection 165 (D).

The movement of the semiconductor chips 110 is not to be limited to the A to D movements but may be variously modified. For example, one of the semiconductor chips 110 may twist or ascend while becoming closer to another of the semiconductor chips 110. Thus, since the semiconductor device 10 includes the interconnection 165, which may be freely bendable, the semiconductor device 10 may be included in, for example, a wearable device.

Portions of the interconnection 165, which are adjacent to the semiconductor chips 110, may be disposed on sidewalls 110ca of the semiconductor chips 110 which face the space region 80. For example, edges of the interconnection 165 may adhere to the sidewalk 110ca of the semiconductor chips 110 and a central portion of the interconnection 165 may bend freely.

According to one or more exemplary embodiments of the present inventive concept, the interconnection 165 might not be disposed on the sidewalls 110ca of the semiconductor chips 110 (see, e.g., FIG. 1F). Thus, substantially the entire interconnection 165 may bend freely.

Figure 2A:
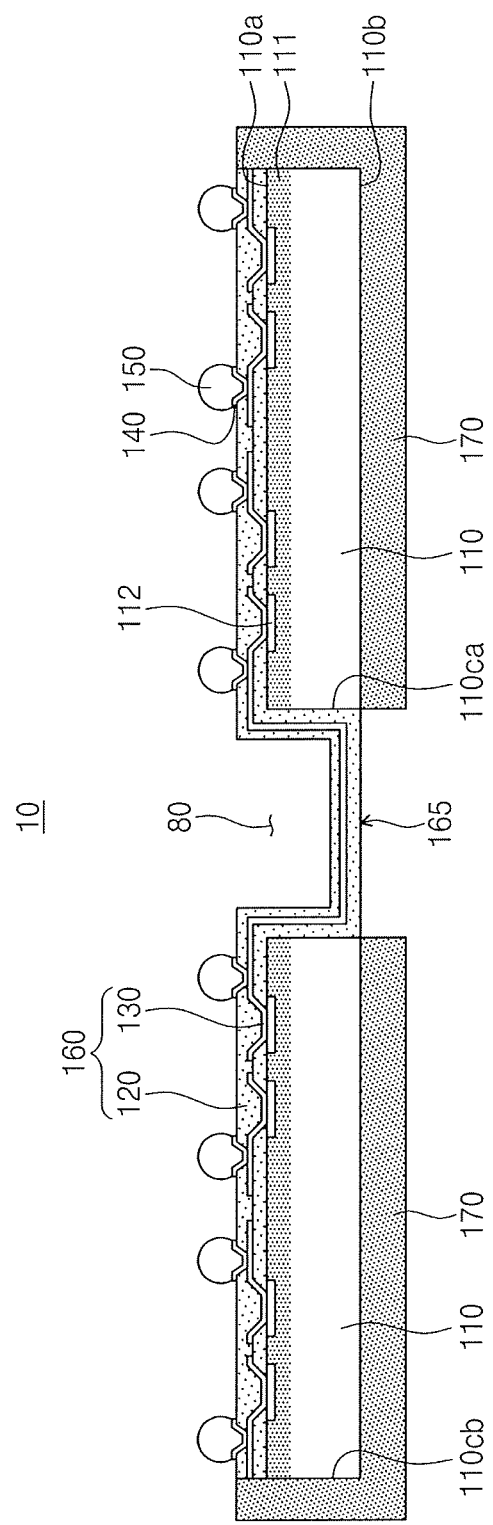
FIGS. 2A and 2B are cross-sectional views illustrating a semiconductor device according to some exemplary embodiments of the present inventive concept.
Figure 2B:
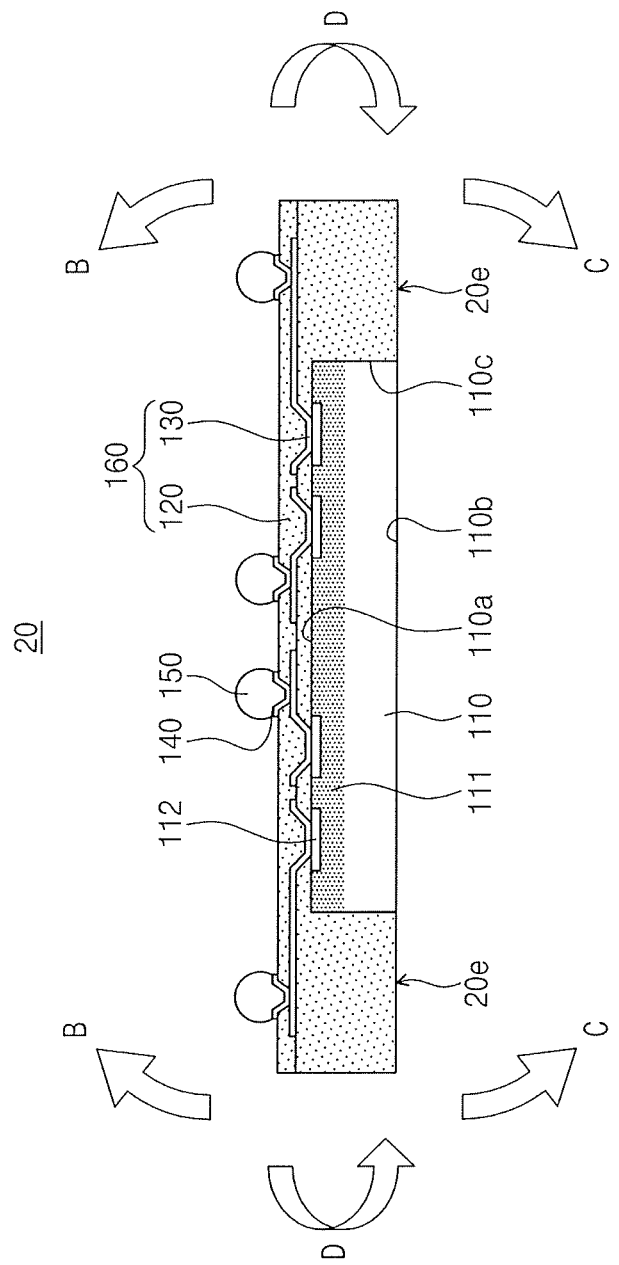

FIGS. 2A and 2B are cross-sectional views illustrating a semiconductor device according to some exemplary embodiments of the present inventive concept.

Referring to FIG. 2A, the semiconductor device 10 may further include mold layers 170 disposed on each of the semiconductor chips 110. The mold layer 170 may be disposed on the bottom surface 110b of the semiconductor chip 110. The mold layer 170 may cover a sidewall 110cb of the semiconductor chip 110 which does not face the space region 80. The mold layers 170 disposed on adjacent semiconductor chips 110 need not be connected to each other, and thus the mold layers 170 need not influence the movement of the semiconductor chips 110. The interconnection 165 may be disposed on the sidewalk 110ca of the semiconductor chips 110, The interconnection 165 may be softer or more flexible than the mold layers 170.

Referring to FIG. 2B, a semiconductor device 20 may include an edge 20e. The edge 20e may be a freely bendable edge. The semiconductor device 20 may include the semiconductor chip 110 and the redistribution layer 160. The semiconductor chip 110 may have the top surface 110a and the bottom surface 110b, and the redistribution layer 160 may be disposed on the top surface 110a of the semiconductor chip 110. The top surface 110a of the semiconductor chip 110 may be the active surface, and the bottom surface 110b of the semiconductor chip 110 may be the inactive surface. The redistribution layer 160 may include the redistribution line 130 and the flexible insulating layer 120 (e.g., an organic layer 120) surrounding the redistribution line 130.

The organic layer 120 of the redistribution layer 160 may be disposed on sidewalls 110c of the semiconductor chip 110. The edge 20e of the semiconductor device 20 may bend freely. For example, the edge 20e of the semiconductor device 20 may ascend (B), descend (C) and/or twist (D).

FIGS. 3A to 3G are cross-sectional views illustrating a method for fabricating a semiconductor device according to some exemplary embodiments of the present inventive concept.

Figure 3A:
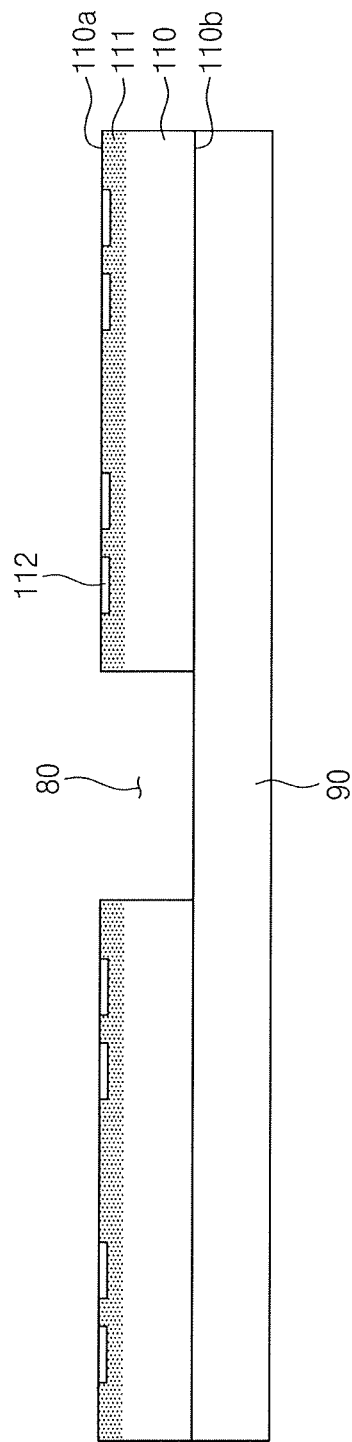

Referring to FIG. 3A, a plurality of semiconductor chips 110 may be disposed on a support plate 90. The semiconductor chips 110 may be spaced apart from each other by the space region 80 disposed between adjacent semiconductor chips 110. The support plate 90 may include a silicon wafer or a glass substrate. The semiconductor chip 110 may have a top surface 110a and a bottom surface 110b. The semiconductor chip 110 may include a memory chip, a logic chip, or a combination thereof. For example, the semiconductor chip 110 may have a system-in-package (SIP) or a system-on-chip (Sots) configuration.

The top surface 110a of the semiconductor chip 110 may be an active surface on which one or more bonding pads 112 and a circuit layer 111 electrically connected to the bonding pads 112 are disposed. The bottom surface 110b of the semiconductor chip 110 may be an inactive surface. The support plate 90 may be in contact with the bottom surfaces 110b of the semiconductor chips 110.

Figure 3B:
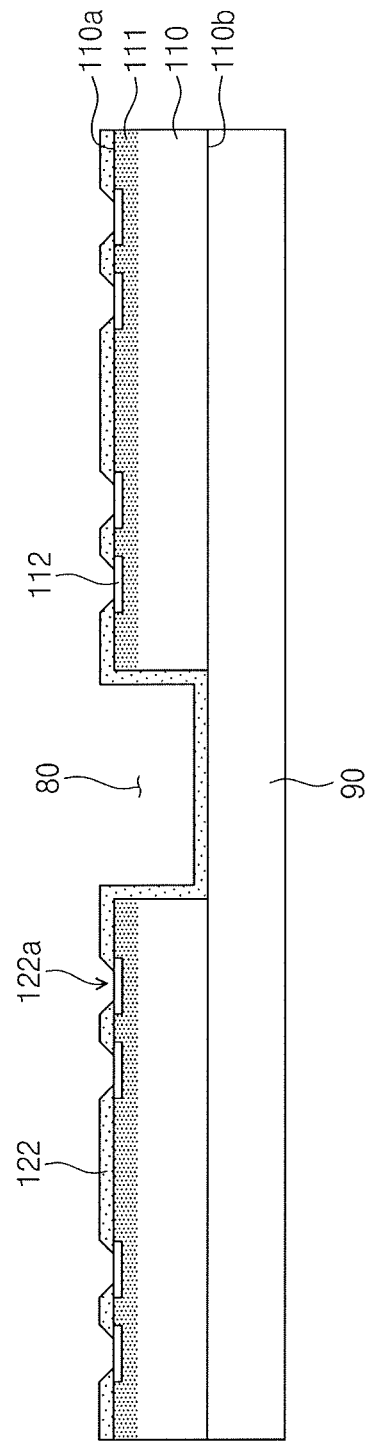

Referring to FIG. 3B, a lower insulating layer 122 may be disposed on the top surfaces 110a of the semiconductor chips 110. The lower insulating layer 122 may be disposed on the support plate 90 exposed by the space region 80. The lower insulating layer 122 may include openings 122a exposing the bonding pads 112. For example, the lower insulating layer 122 may be formed by a coating process or a deposition process, and the openings 122a may be formed in the lower insulating layer 122 by means of an etching process.

The lower insulating layer 122 may include an organic layer (e.g., polyimide) which is softer than the semiconductor chip 110 or may include a main constituent (e.g., silicon) of the semiconductor chip 110. However, exemplary embodiments of the present inventive concept are not limited thereto. For example, the organic layer is not limited to polyimide. In some exemplary embodiments of the present inventive concept, the organic layer may include other insulating material softer than the main constituent of the semiconductor chip 110. For example, the organic layer may include a polymer such as polyvinyl alcohol (PVA), polyvinyl phenol (PVP), or polymethyl methacrylate (PMMA).

Referring to FIG. 3C, redistribution lines 130 may be electrically connected to the bonding pads 112. In some exemplary embodiments of the present inventive concept, a metal (e.g., copper or aluminum) may be deposited, and the deposited metal may be selectively etched to form the redistribution lines 130. The redistribution lines 130 may be electrically connected to the bonding pads 112 through the openings 122a of the lower insulating layer 122. One or more redistribution lines 130 in the space region 80 may electrically connect the semiconductor chips 110 to each other.

Referring to FIG. 3D, an upper insulating layer 124 may be disposed on the lower insulating layer 122 and the redistribution lines 130. The upper insulating layer 124 may include openings 124a formed using, for example, an etching process. The openings 124a of the upper insulating layer 124a may expose portions of the redistribution lines 130. The upper insulating layer 124 may include the same or similar organic layer as the lower insulating layer 122. The lower insulating layer 122 and the upper insulating layer 124 may be included in the flexible insulating layer 120 surrounding the redistribution lines 130. Thus, a redistribution layer 160 may include the redistribution lines 130, the lower insulating layer 122 and the upper insulating layer 124. The redistribution layer 160 may include the redistribution lines 130 and the flexible insulating layer 120 surrounding the redistribution lines 130.

Figure 3E:
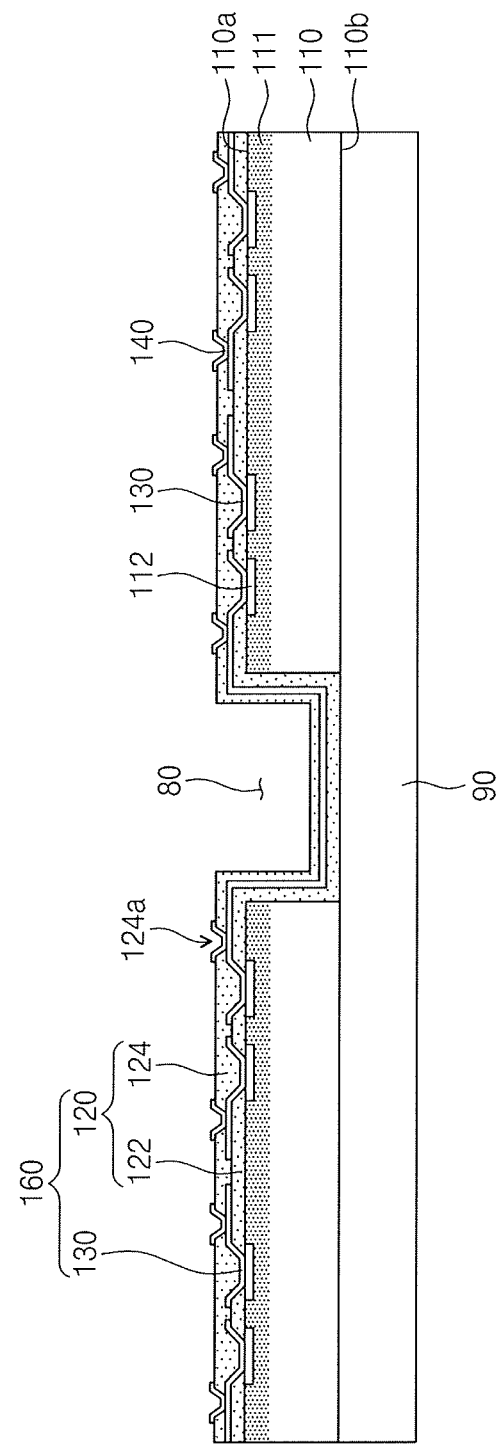

Referring to FIG. 3E, landing pads 140 electrically connected to the redistribution lines 130 may be formed by depositing a conductive material (e.g., a metal) and etching the deposited conductive material. The landing pads 140 may be electrically connected to the redistribution lines 130 through the openings 124a of the upper insulating layer 124.

Figure 3F:
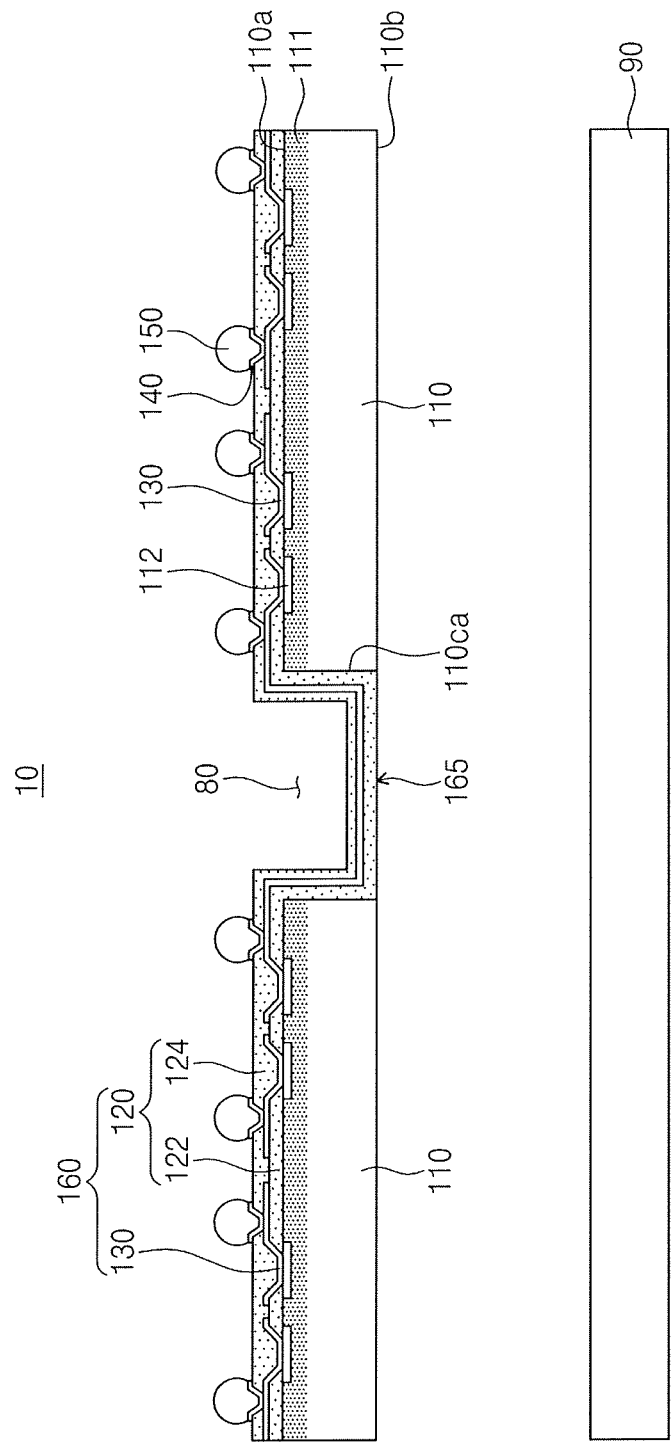

Referring to FIG. 3F, external terminals 150 may be electrically connected to the landing pads 140. For example, a solder may be deposited, and a reflow process may be performed on the deposited solder to form the external terminals 150 (e.g., solder balls) connected to the landing pads 140. The support plate 90 may be detached from the semiconductor chips 110, and thus the semiconductor device 10 including a flexible interconnection 165 electrically connecting the semiconductor chips 110 to each other may be formed. The interconnection 165 may be disposed on or might not be disposed on sidewalls 110ca of the semiconductor chips 110, which face the space region 80. The external terminals 150 need not be formed on the interconnection 165.

Figure 3G:
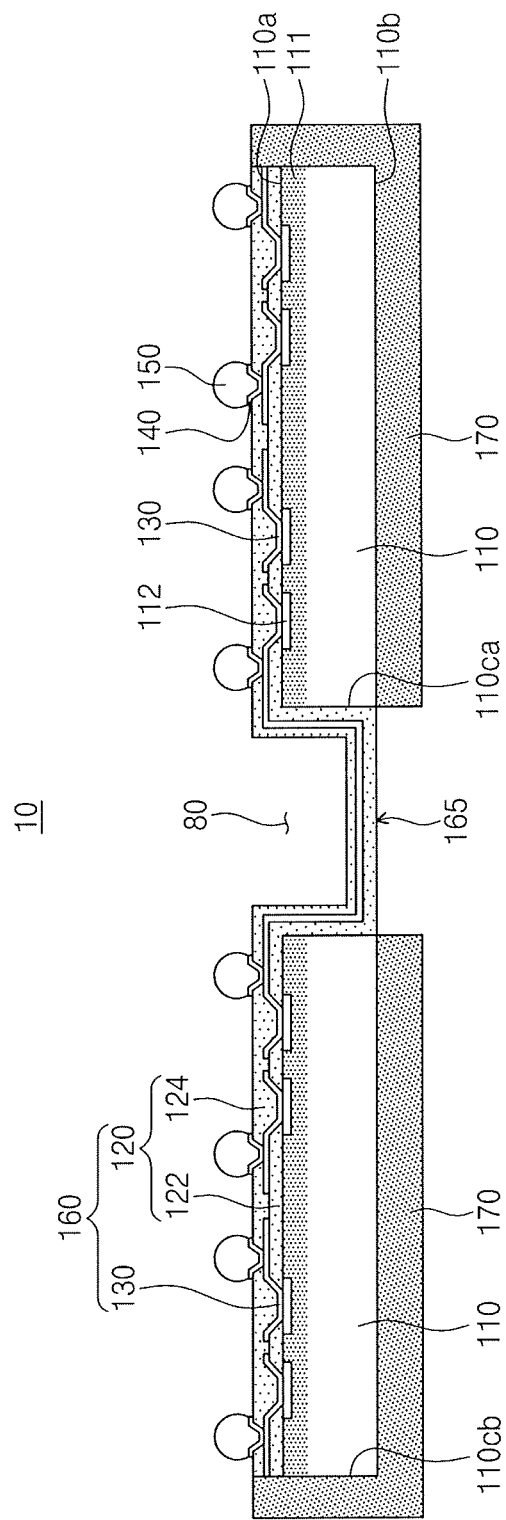

Referring to FIG. 3G, mold layers 170 may be disposed on the semiconductor chips 110. The mold layer 170 may be disposed on the bottom surface 110b of the semiconductor chip 110. In some exemplary embodiments of the present inventive concept, the mold layer 170 may be disposed on a sidewall 110b of the semiconductor chip 110, which does not face the space region 80. In some exemplary embodiments of the present inventive concept, the mold layers 170 may respectively cover one or more surfaces of the semiconductor chips 110 but might not be connected to each other.

FIGS. 4A to 4D are cross-sectional views illustrating a method for fabricating a semiconductor device according to some exemplary embodiments of the present inventive concept.

Referring to FIG. 4A, the semiconductor chips 110 may be disposed on the support plate 90. The support plate 90 may include a protrusion 95 filling the space region 80 between the semiconductor chips 110. In some exemplary embodiments of the present inventive concept, a top surface 95a of the protrusion 95 may be substantially coplanar with the top surfaces 110a of the semiconductor chips 110. In some exemplary embodiments of the present inventive concept, the top surface 95a of the protrusion 95 may be disposed at a higher or lower level than the top surfaces 110a of the semiconductor chips 110.

Figure 4B:
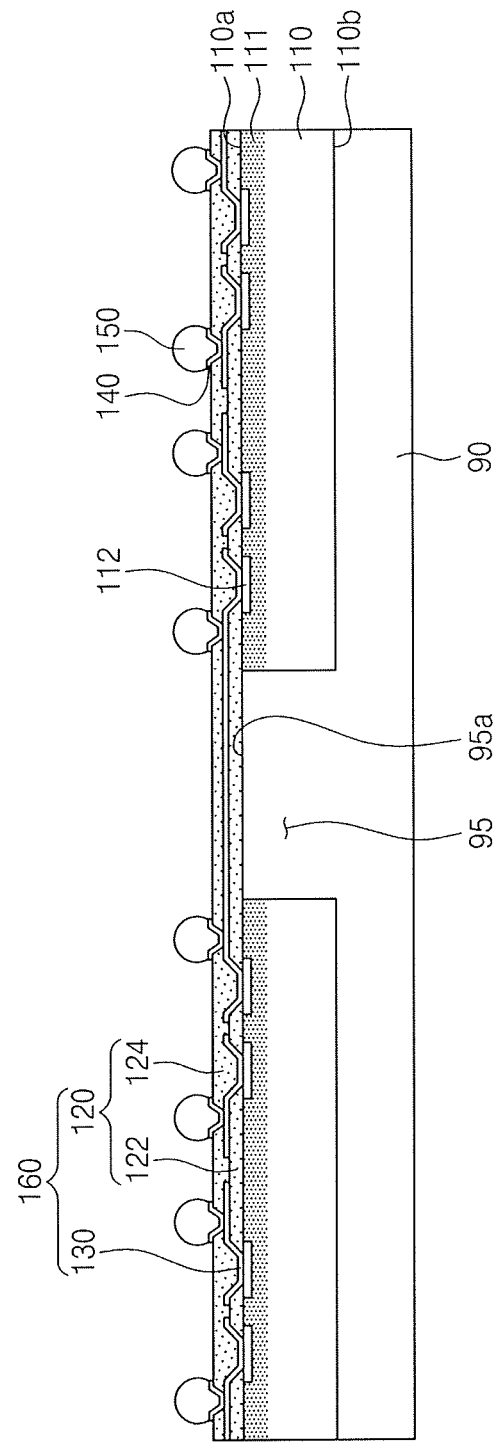

Referring to FIG. 4B, using processes substantially identical or similar to those described with reference to FIGS. 3B to 3E, the redistribution layer 160 and the external terminals 150 may be formed on the top surfaces 110a of the semiconductor chips 110. The redistribution layer 160 may include the flexible insulating layer 120 surrounding the redistribution lines 130. The external terminals 150 may be electrically connected to the redistribution lines 130 through the landing pads 140.

Figure 4C:
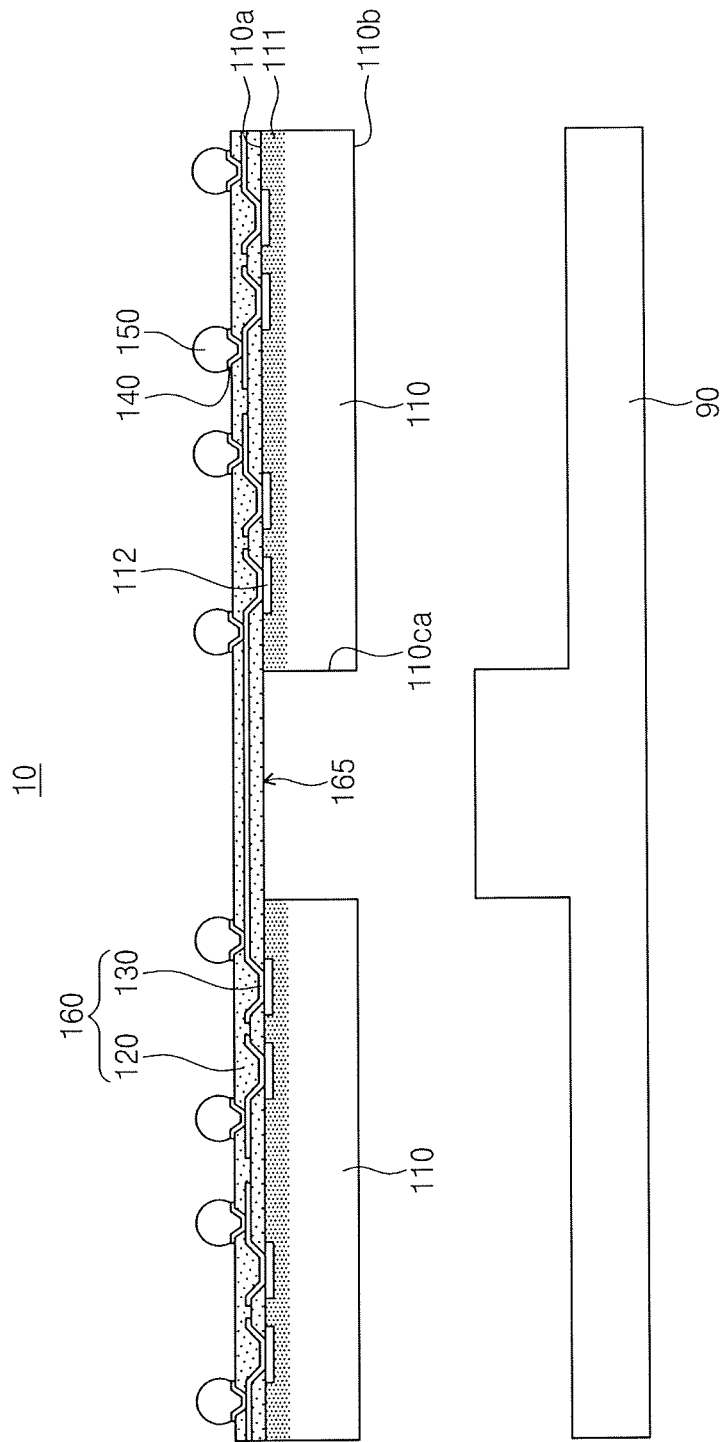

Referring to FIG. 4C, the support plate 90 may be detached from the semiconductor chips 110, and thus the semiconductor device 10 including the flexible interconnection 165 which electrically connects the semiconductor chips 110 to each other may be formed. The interconnection 165 need not adhere to the sidewalls 110ca of the semiconductor chips 110.

Figure 4D:
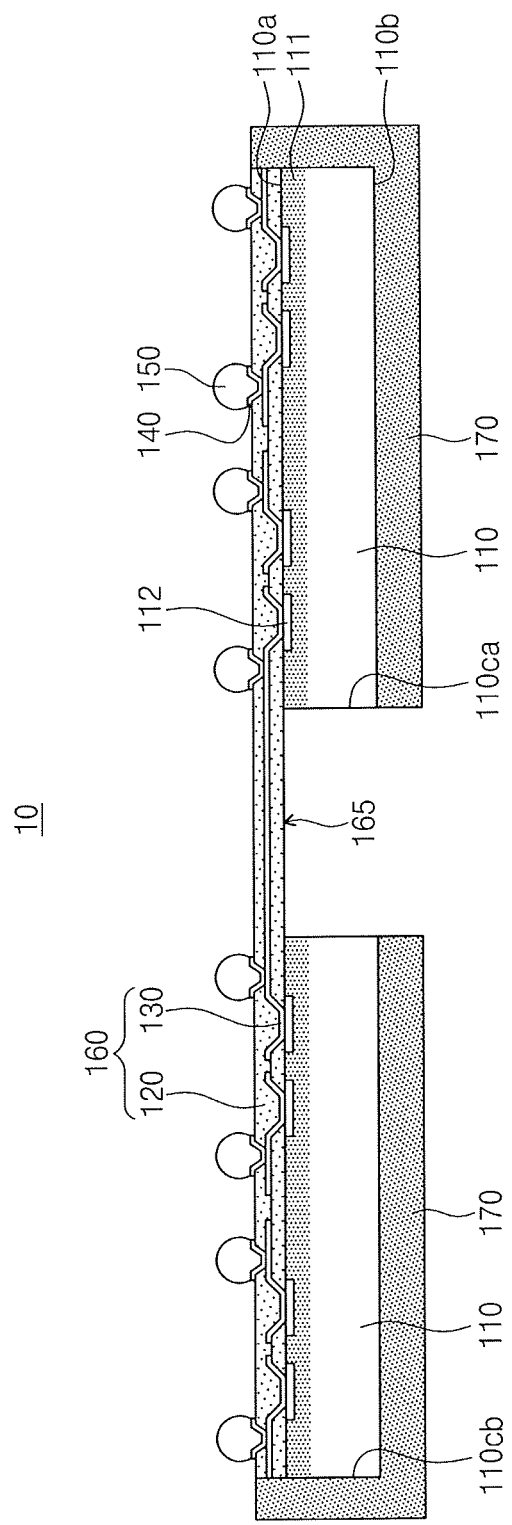

Referring to FIG. 4D, the mold layers 170 may cover the bottom surfaces 110b of the semiconductor chips 110. The mold layer 170 may cover the sidewall 110cb of the semiconductor chip 110, which does not face the space region 80.

Figure 5A:
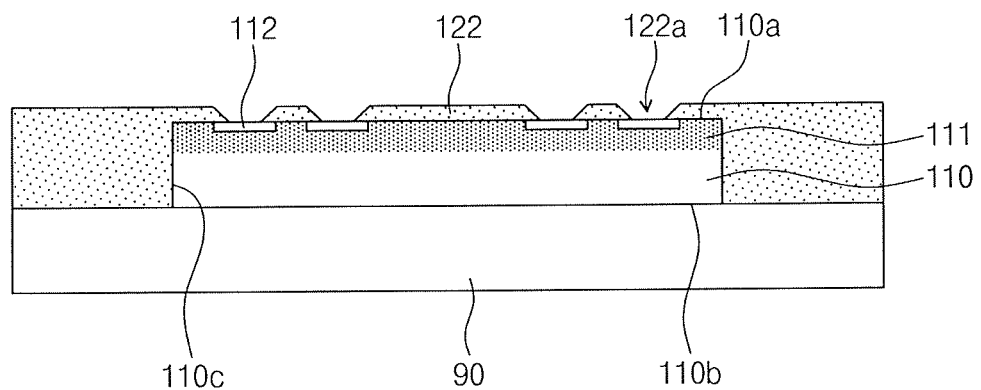
FIGS. 5A to 5C are cross-sectional views illustrating a method for fabricating a semiconductor device according to some exemplary embodiments of the present inventive concept.
Figure 5B:
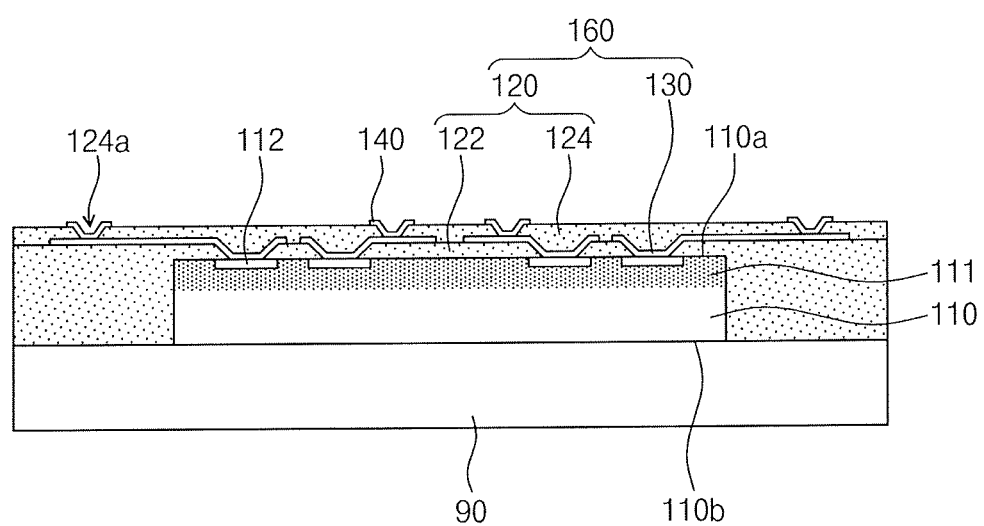
Figure 5C:
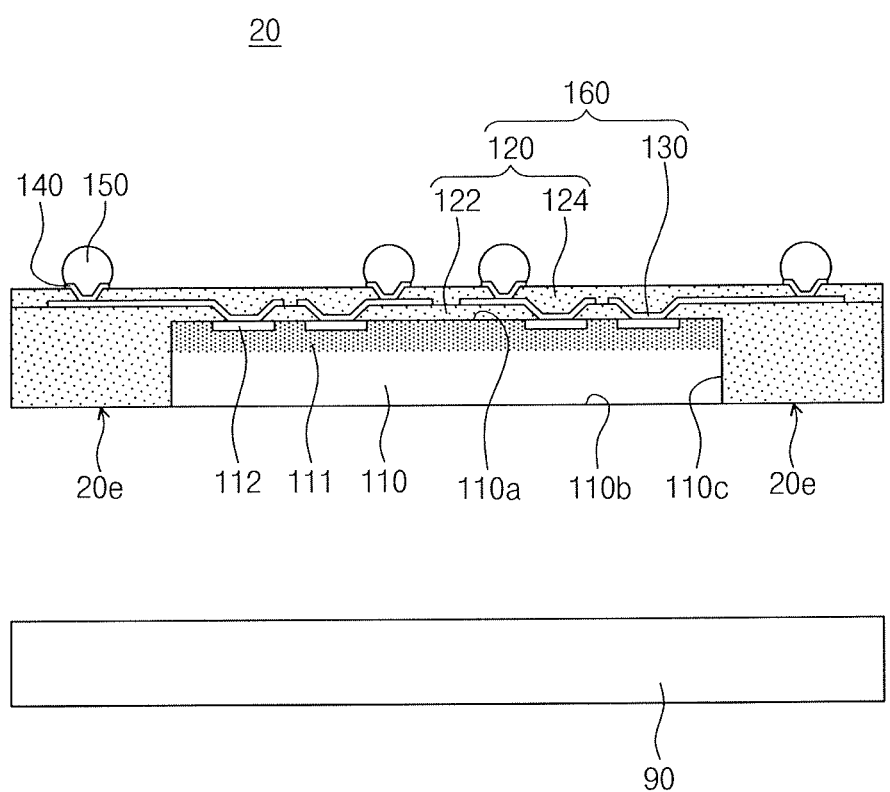

FIGS. 5A to 5C are cross-sectional views illustrating a method for fabricating a semiconductor device according to some exemplary embodiments of the present inventive concept.

Referring to FIG. 5A, the semiconductor chip 110 may be disposed on the support plate 90, and the material (e.g., an organic layer such as polyimide) softer than the semiconductor chip 110 may be provided on the top surface 110a of the semiconductor chip 110 to form the lower insulating layer 122. The lower insulating layer 122 may include the openings 122a exposing the bonding pads 112. In some exemplary embodiments of the present inventive concept, the lower insulating layer 122 may be disposed on the sidewall 110c of the semiconductor chip 110.

Referring to FIG. 5B, the redistribution lines 130 may be disposed on the lower insulating layer 122, and may be electrically connected to the bonding pads 112. The upper insulating layer 124 covering the redistribution lines 130 may include the same or similar material as the lower insulating layer 122. Thus, the redistribution layer 160 may be formed such that the flexible insulating layer 120 may surround the redistribution lines 130. An etching process may be selectively performed on the upper insulating layer 124 to form the openings 124a exposing portions of the redistribution lines 130. The landing pads 140 may be electrically connected to the redistribution lines 130 through the openings 124a of the upper insulating layer 124.

Referring to FIG. 5C, the external terminals 150 may be electrically connected to the landing pads 140. The support plate 90 may be detached from the semiconductor chip 110, and thus the semiconductor device 20 including the bendable and flexible edge 20e may be formed.

According to exemplary embodiments of the present inventive, concept, the semiconductor chips included in the semiconductor device may be electrically connected to each other through the flexible interconnection which is freely bendable, and thus the semiconductor device may be conformally disposed on a non-flat surface. Thus, the semiconductor device according to exemplary embodiments of the present inventive concept may be included in a wearable device and may be used in a repeated bending environment.

While the present inventive concept has been particularly shown and described with reference to exemplary embodiments thereof, it will be understood by those of ordinary skill in the art that various changes in form and detail may be made therein without departing from the spirit and scope of the present inventive concept.

What is claimed is:
1. A semiconductor device comprising:
   a first semiconductor chip having a circuit layer; and
   a redistribution layer disposed on the circuit layer of the first semiconductor chip,
   wherein the redistribution layer comprises:
      a redistribution line electrically connected to the circuit layer; and
      an insulating layer surrounding the redistribution line,
   wherein a portion of the insulating layer covers a sidewall of the first semiconductor chip,
   wherein a portion of the redistribution line is disposed on the portion of the insulating layer,
   wherein the insulating layer is more flexible than the first semiconductor chip, and
   wherein the redistribution layer extends sideward from the first semiconductor chip to a second semiconductor chip such that a distance between the first and second semiconductor chips changes when the redistribution layer is bent.

2. The semiconductor device according to claim 1, wherein the portion of the insulating layer is bendable such that an edge of the semiconductor device becomes ascended, descended or twisted.

3. The semiconductor device according to claim 1, further comprising:
   external terminals disposed on the redistribution layer and electrically connected to the redistribution line, and
   wherein at least one of the external terminals is arranged on the outer side of the first semiconductor chip, in a plain view.

4. The semiconductor device of claim 1, wherein the redistribution layer covers an active surface.

5. The semiconductor device of claim 1, wherein the first semiconductor chip comprises bonding pads electrically connected to the circuit layers,
   wherein the insulating layer comprises:

a first organic layer disposed on an active surface and having first openings exposing the bonding pads, wherein the redistribution line is electrically connected to the bonding pads through the first openings; and a second organic layer disposed on the first organic layer and covering the redistribution line.

6. The semiconductor device of claim 5, wherein the first organic layer, the second organic layer and the redistribution line in the portion of the insulating layer covering the sidewall of the first semiconductor chip are provided in one body.

\* \* \* \* \*